(12) United States Patent
Mori et al.

(10) Patent No.: US 7,696,592 B2
(45) Date of Patent: Apr. 13, 2010

(54) SOLID STATE IMAGING APPARATUS METHOD FOR FABRICATING THE SAME AND CAMERA USING THE SAME

(75) Inventors: Mitsuyoshi Mori, Kyoto (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 497 days.

(21) Appl. No.: 10/571,426

(22) PCT Filed: Jun. 28, 2005

(86) PCT No.: PCT/JP2005/011825

§ 371 (c)(1),
(2), (4) Date: Mar. 10, 2006

(87) PCT Pub. No.: WO2006/006392

PCT Pub. Date: Jan. 19, 2006

(65) Prior Publication Data

US 2008/0105906 A1    May 8, 2008

(30) Foreign Application Priority Data

Jul. 7, 2004   (JP) .............................. 2004-201047

(51) Int. Cl.
*H01L 31/058*   (2006.01)

(52) U.S. Cl. ....................... 257/439; 257/431; 257/462; 257/547; 257/E31.011; 257/E31.055

(58) Field of Classification Search .................. 438/435, 438/237, 298, 356, 405, 414–419, 420; 257/E31.058, 257/E31.063, E31.115, E31.032, E25.032, 257/E27.133–E27.139, 101, 520, E29.221, 257/290–292, 431, E27.123, E31.092, 79, 257/80, 83–85, 88, 93, 94, 96, 97, 102, 103, 257/184, 185, 187, 192, 428, 439, 462, 544, 257/547, E27.12, E33.047, E33.048, E27.121, 257/E31.011, E31.053, E31.054, E31.055, 257/E31.073, E31.076
See application file for complete search history.

(56) References Cited

U.S. PATENT DOCUMENTS 6,583,377 B2 *   6/2003   Zehavi et al. .......... 219/121.46

(Continued)

FOREIGN PATENT DOCUMENTS

JP   52-86782 A   7/1977

(Continued)

*Primary Examiner*—Matthew C Landau
*Assistant Examiner*—Joseph C Nicely
(74) *Attorney, Agent, or Firm*—McDermott Will & Emery LLP

(57) ABSTRACT

A solid state imaging apparatus includes a plurality of photoelectric conversion sections formed in an imaging area of a silicon substrate, and an embedded layer embedded in an isolation trench formed in at least one part of the silicon substrate located around the photoelectric conversion sections. The embedded layer is made of an isolation material having a thermal expansion coefficient larger than silicon oxide and equal to or smaller than silicon.

8 Claims, 14 Drawing Sheets

U.S. PATENT DOCUMENTS

| | | | |
|---|---|---|---|
| 6,888,214 B2 * | 5/2005 | Mouli et al. | 257/510 |
| 6,900,091 B2 * | 5/2005 | Williams et al. | 438/228 |
| 6,964,905 B2 * | 11/2005 | Inoue | 438/296 |
| 7,288,801 B2 * | 10/2007 | Raynor | 257/184 |
| 7,492,027 B2 * | 2/2009 | Mouli | 257/446 |
| 7,534,691 B2 * | 5/2009 | Cole et al. | 438/368 |
| 2004/0048444 A1 * | 3/2004 | Seo | 438/427 |
| 2004/0127035 A1 * | 7/2004 | Lee | 438/689 |
| 2005/0090074 A1 * | 4/2005 | Mouli et al. | 438/430 |
| 2006/0108617 A1 * | 5/2006 | Kitano et al. | 257/291 |
| 2008/0048287 A1 * | 2/2008 | Williams et al. | 257/513 |
| 2009/0011533 A1 * | 1/2009 | Mouli et al. | 438/59 |
| 2009/0098679 A1 * | 4/2009 | Abe et al. | 438/80 |

FOREIGN PATENT DOCUMENTS

| | | | |
|---|---|---|---|
| JP | 53-148394 A | | 12/1978 |
| JP | 61-141175 A | | 6/1986 |
| JP | 62-86756 A | | 4/1987 |
| JP | 63-58852 A | | 3/1988 |
| JP | 1-161757 A | | 6/1989 |
| JP | 2001-85658 A | | 3/2001 |
| JP | 2002-270808 A | | 9/2002 |
| JP | 2004-39832 A | | 2/2004 |
| JP | 200439832 A | * | 2/2004 |
| JP | 2004039832 A | * | 2/2004 |
| JP | 2004-172394 A | | 6/2004 |
| JP | 2004172394 A | * | 6/2004 |

* cited by examiner

SOLID STATE IMAGING APPARATUS METHOD FOR FABRICATING THE SAME AND CAMERA USING THE SAME

RELATED APPLICATION

This application is the U.S. National Phase under 35 U.S.C. §371 of International Application No. PCT/JP2005/011825, filed on Jun. 28, 2005, which in turn claims the benefit of Japanese Application No. 2004-201047, filed on Jul. 7, 2004, the disclosures of which Applications are incorporated by reference herein.

TECHNICAL FIELD

The present invention relates to a solid state imaging apparatus in which an imaging area including a plurality of pixels is formed at part of a substrate, a method for fabricating the same, and a camera.

BACKGROUND ART

A complementary-metal-oxide-semiconductor (CMOS) solid state imaging apparatuses represents an image sensor in which a signal accumulated in a photodiode forming part of each of pixels is read out by an amplifier circuit including a MOS transistor. Such a CMOS solid state imaging apparatus can operate at low voltages, consume less power, and be integrated in one chip together with a peripheral circuit.

In view of the above, attention has been paid to CMOS solid state imaging apparatuses as image input devices used for compact cameras for personal computers and portable devices, such as cell phones. In recent years, an increase in the number of pixels have been demanded for CMOS solid state imaging apparatuses, and therefore the cell size per pixel tends to be reduced.

In a known solid state imaging apparatus, a thermal oxide film is generally formed, by local oxidation of silicon (LOCOS), in an isolation region for isolating a photodiode formed in a semiconductor substrate and semiconductor devices from one another. In the use of LOCOS, the width of the isolation region needs to be increased to provide a sufficient isolation property. Furthermore, when a thermal oxide film is formed by LOCOS, a bird's beak occurs and therefore the isolation region enters into an active region of the semiconductor substrate. This makes it necessary to previously secure a wide active region. In view of the above, the area of the isolation region occupied in each of pixels and the area of the active region occupied therein must be increased. This makes it difficult to reduce the size of the pixel.

The following known art is used as a measure for solving such a problem (see Patent Document 1). FIG. 14 illustrates a cross-sectional structure of a photodiode section of a solid state imaging apparatus according to a known example.

As illustrated in FIG. 14, a photodiode 62 including a P⁻-type silicon layer 55, an N-type silicon layer 54 and a P⁺-type silicon layer 56 is formed in the vicinity of the top surface of an N-type silicon substrate 53.

An isolation region 52 is formed in the vicinity of part of the top surface of the N-type silicon substrate 53 located around the photodiode 62 to extend from the uppermost surface of the N-type silicon substrate 53 to substantially the same depth as that of the N-type silicon layer 54 and have a shallow trench isolation (STI) structure in which a trench having inner walls covered with a silicon dioxide ($SiO_2$) film 61 is filled with an insulating film made of $SiO_2$ and any other material. Therefore, the photodiode 62 is electrically isolated from other peripheral devices in the top surface of the N-type silicon substrate 53.

Since in the known example the isolation region 52 is formed to have a STI structure, a bird's beak does not occur and therefore the isolation region 52 does not enter into a light-receiving area 51. Therefore, the area of the light-receiving area 51 is not reduced due to a bird's beak. As a result, a large light-receiving area 51 can be secured. Furthermore, in the case of the isolation region 52 of a STI structure, the width of an insulative material necessary for isolation is smaller than in the case of the isolation region 52 of a LOCOS structure or any other structure. This can reduce the area of the isolation region itself, resulting in the enhanced sensitivity of the photodiode.

Patent Document 1: Japanese Unexamined Patent Publication No. 2004-39832

DISCLOSURE OF INVENTION

Problems that the Invention is to Solve

Since in the known example the isolation region is formed to have a STI structure, process steps of forming a trench in the top surface of the silicon substrate by etching, forming a $SiO_2$ film on the inner walls of the trench by heat treatment or any other method and then filling the trench with an insulating film are required for the formation of the isolation region.

When such an isolation region of a STI structure is formed and a trench is filled with $SiO_2$ serving as an insulating film, silicon defects are caused in the vicinity of the interface between an isolation region and the other region of a silicon substrate. Furthermore, the difference in thermal expansion coefficient between the silicon substrate and $SiO_2$ causes stress-induced defects in a heat treatment process step of a fabrication process for a solid state imaging apparatus.

When such defects are caused, not only photoelectrically converted charges but also charges caused by stress and silicon defects are accumulated in a signal charge accumulation section of a photodiode. In other words, in addition to charges produced in the entry of light into the photodiode, even when light is not incident upon a light-receiving area, unnecessary charges are produced and then accumulated in the signal accumulation section. This causes pixel-to-pixel variations in characteristics (random noises) and white defects representing white dots produced when there is no incident light, resulting in the reduced sensitivity of the photodiode.

The present invention has been made to solve the above problems, and an object of the present invention is to provide a high-sensitivity solid state imaging apparatus which prevents the production of random noises and white defects both caused by charges produced due to stress to avoid reduction in the sensitivity of a solid state imaging apparatus, a method for fabricating the same, and a camera.

Means of Solving the Problems

In order to achieve the above object, a solid state imaging apparatus of the present invention is configured such that an isolation region is formed of a material having the same thermal expansion coefficient as a semiconductor substrate.

To be specific, a solid state imaging apparatus of the present invention comprises a photoelectric conversion section formed in an imaging area of the top surface of a silicon substrate, and an isolation region formed in at least one part of the silicon substrate located around the photoelectric conversion section and made of an isolation material having a thermal expansion coefficient larger than silicon oxide and equal to or smaller than silicon.

Since the solid state imaging apparatus of the present invention includes an isolation region made of an isolation material having a thermal expansion coefficient larger than silicon oxide and equal to or smaller than silicon, the thermal expansion coefficient of the isolation region is substantially equal to that of the silicon substrate. Therefore, stress-induced defects can be prevented from being produced in the photoelectric conversion section in heat treatment of a fabrication process for the solid state imaging apparatus. This can prevent unnecessary charges from being produced due to stress and thus reduce random noises and white defects both produced due to the accumulation of unnecessary charges.

In the solid state imaging apparatus of the present invention, the isolation region is preferably made of the isolation material with which an isolation trench is filled, said isolation trench being formed in at least one part of the silicon substrate located around the photoelectric conversion section. With this structure, an isolation region whose thermal expansion coefficient is substantially equal to that of the silicon substrate can be certainly formed.

It is preferable that the solid state imaging apparatus further comprises an insulating film covering the bottom and sidewalls of the isolation trench. With this structure, when a polysilicon interconnect is formed on the embedded layer, the parasitic capacitance between the polysilicon interconnect and the embedded layer can be reduced. This permits a high-speed charge readout operation.

It is preferable that the solid state imaging apparatus further comprises an impurity-doped semiconductor layer formed in a region of the silicon substrate forming the bottom and sidewalls of the isolation trench by doping the region with an impurity. This structure can certainly prevent charges produced at the boundary between the isolation region and a circuit device from being accumulated in the photoelectric conversion section.

In the solid state imaging apparatus of the present invention, the isolation material is preferably silicon. This structure can certainly prevent stress from being applied to the photoelectric conversion section during heat treatment.

It is preferable that the solid state imaging apparatus further comprises a MOS transistor formed in the imaging area, wherein the silicon layer contains an impurity of the opposite conductivity type to source and drain regions of the MOS transistor. With this structure, when a gate interconnect is formed on the isolation region, the parasitic capacitance between the substrate and the gate interconnect can be reduced, resulting in the solid state imaging apparatus operated at high speed.

In the above case, the silicon layer is preferably made of amorphous silicon, polycrystalline silicon or porous silicon. With this structure, damage due to thermal stress can be certainly reduced.

A method for fabricating a solid state imaging apparatus comprises the steps of: forming an isolation trench by etching a region of a silicon substrate; forming an insulating film to cover the bottom and sidewalls of the isolation trench; after the formation of the insulating film, filling the isolation trench with a silicon layer; and implanting an impurity into a predetermined region of the silicon layer.

Since the method for fabricating a solid state imaging apparatus of the present invention includes the step of filling the isolation trench with the silicon layer, the isolation region can be formed of the same material as the silicon substrate. This can prevent the production of defects in the vicinity of the isolation region and the production of defects coming from stress applied to the photoelectric conversion section during heat treatment. As a result, a solid state imaging apparatus allowing only small numbers of random noises and white defects can be fabricated.

It is preferable that the method further comprises the step of making the silicon layer porous. The step of making the silicon layer porous preferably includes the steps of: attaching an electrode to part of the silicon layer; and immersing, in a solution, part of the silicon layer excluding the part thereof to which the electrode is attached and then passing current via the electrode through the silicon layer. With this structure, an isolation region composed of a porous film with a small permittivity can be formed without causing damage to devices formed at parts of the substrate.

A camera comprises the solid state imaging apparatus of the present invention. With this structure, the camera can include a solid state imaging apparatus allowing only small numbers of random noises and white defects, and a camera permitting high-resolution imaging can be achieved.

EFFECT OF THE INVENTION

A solid state imaging apparatus of the present invention, a method for fabricating the same and a camera using the same achieve reduction in the pixel size and increase in the area of a light-receiving area while securing the electrical isolation property of an isolation region. In addition, a solid state imaging apparatus allowing only small numbers of random noises and white defects, a fabrication method for the same and a camera can be achieved.

BRIEF DESCRIPTION OF DRAWINGS

FIGS. 5(a) and 5(b) illustrate an exemplary solid state imaging apparatus according to the first embodiment of the present invention, in which FIG. 5(a) is a cross-sectional view taken along the line Va-Va in FIG. 1 and FIG. 5(b) is a cross-sectional view taken along the line Vb-Vb in FIG. 1.

FIGS. 6(a) and 6(b) illustrate another exemplary solid state imaging apparatus according to the first embodiment of the present invention, in which FIG. 6(a) is a cross-sectional view taken along the line Va-Va in FIG. 1 and FIG. 6(b) is a cross-sectional view taken along the line Vb-Vb in FIG. 1.

Figure 1:
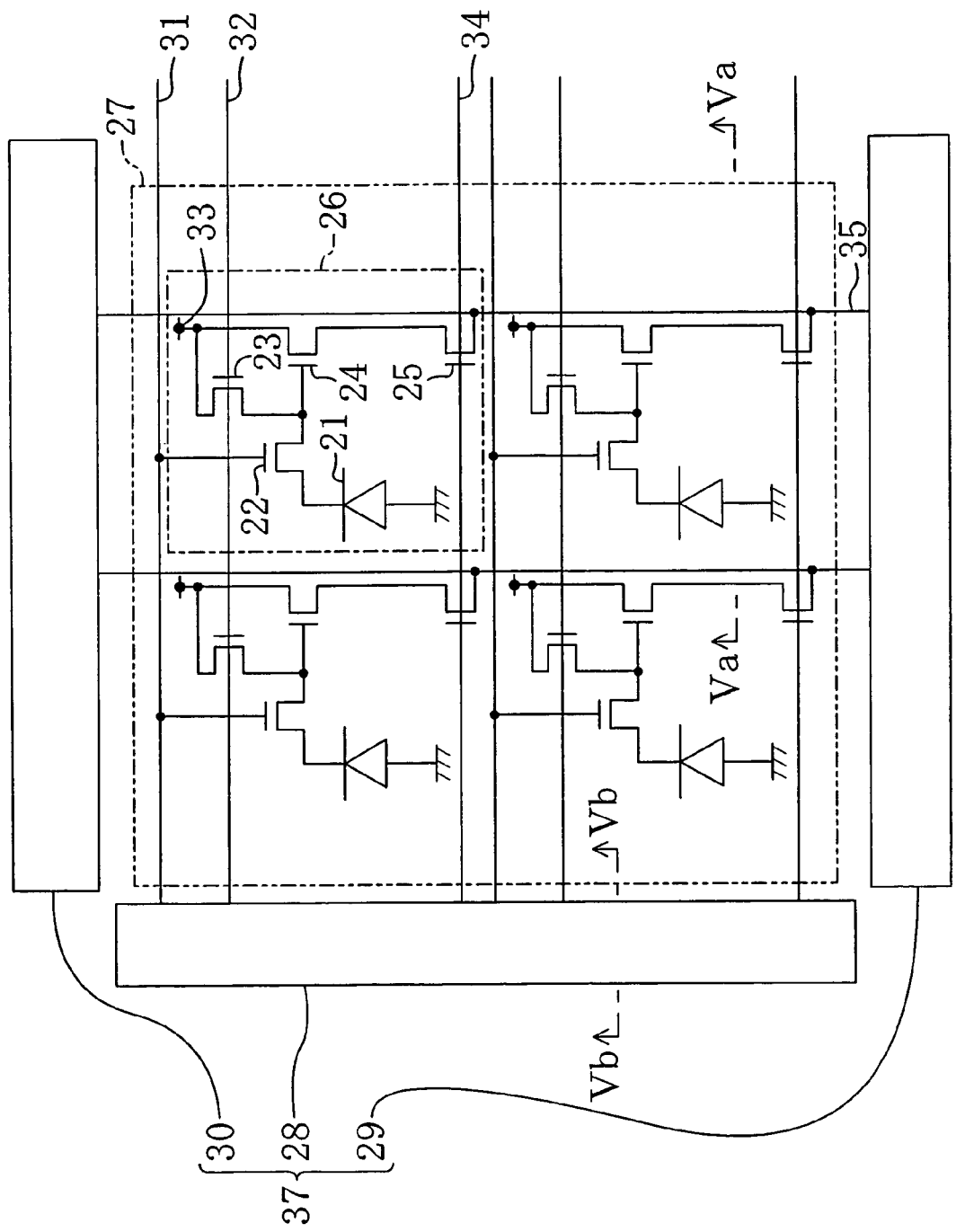
FIG. 1 is a circuit diagram illustrating a solid state imaging apparatus according to a first embodiment of the present invention.

DESCRIPTION OF NUMERALS 1 semiconductor substrate
2 photodiode
3 isolation region
4 first semiconductor layer
5 P$^+$-type surface layer
6 second semiconductor layer
7 P$^+$-type silicon layer
8 P-type silicon layer
9 insulating film
10 pad insulating film
11 oxidation-resistant film
12 opening
13 trench
14 embedded layer
15 porous silicon film
16 P-type silicon section
17 silicon film containing N-type impurity
18 silicon film containing P-type impurity
20 STI structure
21 photodiodes
22 transfer transistors
23 reset transistors
24 amplification transistors
25 select transistors
26 pixels
27 imaging area
28 vertical shift register
29 horizontal shift register
30 timing generator circuit
31 output pulse line
32 output pulse line
33 power source
34 output pulse line
37 peripheral-circuit area
41 silicon film
42 porous silicon film
51 light-receiving area
52 isolation region
53 N-type silicon substrate
54 N-type silicon layer
55 P$^-$-type silicon layer
56 P$^+$-type silicon layer
57 P$^+$-type channel stopper layer
58 P-type surface well
59 P-type deep well
60 P-type plug well
61 silicon oxide film
102 electrode
111 reactor
112 electrode
113 conductive line
114 constant-current source
115 silicon wafer stage
116 infrared cut-filter
117 tungsten lamp
118 O-ring
119 reaction solution

BEST MODE FOR CARRYING OUT THE INVENTION

Embodiment 1

A solid state imaging apparatus according to a first embodiment of the present invention and a fabrication method for the same will be described hereinafter with reference to the drawings.

FIG. 1 illustrates a circuit diagram of a CMOS solid state imaging apparatus of this embodiment. As illustrated in FIG. 1, an imaging area 27 in which a plurality of pixels 26 are arranged in matrix, a vertical shift register 28 and a horizontal shift register 29 each for selecting a pixel, and a timing generator circuit 30 for supplying a necessary pulse to the vertical shift register 28 and the horizontal shift register 29 are formed on one substrate.

Each of the pixels 26 arranged in the imaging area 27 is composed of a photodiode 21 serving as a photoelectric conversion section and associated semiconductor devices. A transfer transistor 22 is connected at its source to an output part of the photoelectric conversion section 21. Connected to the drain of a transfer transistor 22 are the source of a reset transistor 23 connected at its drain to a power source 33 and the gate of an amplifier transistor 24 connected at its drain to the power source 33 and at its source to the drain of a select transistor 25.

The transfer transistor 22, the reset transistor 23 and the select transistor 25 are connected at their gates to an output pulse line 31, an output pulse line 32 and an output pulse line 34 all from the vertical shift register 28, respectively. The select transistor 25 is connected at its source to an output pulse line 35 from the horizontal shift register 29.

Figure 2:
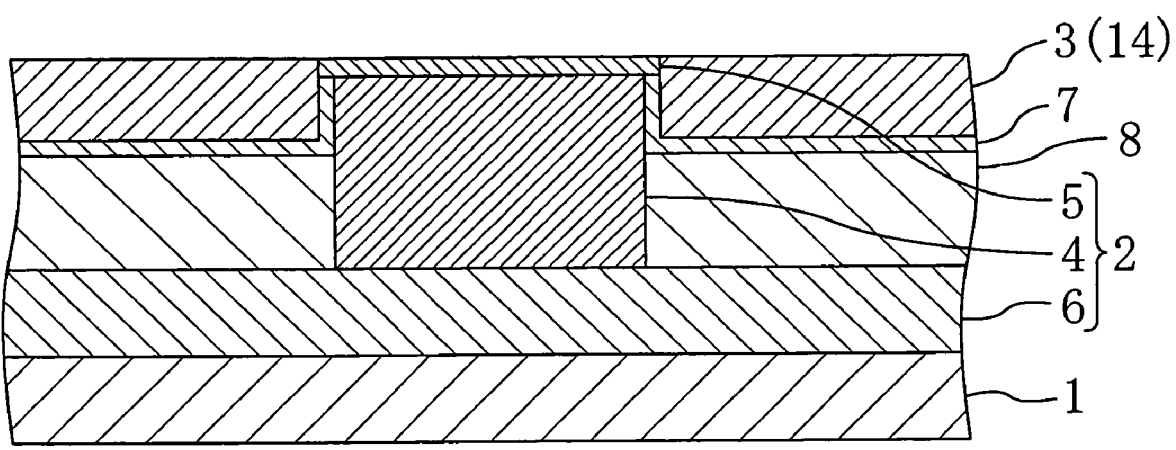
FIG. 2 is a cross-sectional view illustrating a photodiode section of a solid state imaging apparatus according to the first embodiment of the present invention.

FIG. 2 illustrates a cross-sectional structure of a photodiode 21 section of the solid state imaging apparatus of this embodiment. As illustrated in FIG. 2, a photodiode 2 serving as a photoelectric conversion section has a PNP structure and includes a thin P$^+$-type surface layer 5 formed in the uppermost surface of a substrate 1 of semiconductor of N-type silicon and a first semiconductor layer 4 of N-type silicon and a second semiconductor layer 6 of P$^-$-type silicon successively formed immediately below the P$^+$-type surface layer 5 and serving as a charge accumulation region.

When light incident upon the photodiode 2 reaches the pn-junction interface between the first semiconductor layer 4 and the P$^+$-type surface layer 5 or a second semiconductor layer 6, the light is subjected to photoelectric conversion, leading to the production of positive holes and electrons. Therefore, signal charges (electrons) corresponding to the amount of the incident light are accumulated in a depletion-layer region produced between the first semiconductor layer 4 and the P$^+$-type surface layer 5 and a depletion-layer region produced between the first semiconductor layer 4 and the second semiconductor layer 6. The P$^+$-type surface layer 5 formed in the uppermost surface of the substrate 1 of semiconductor can reduce the charges produced in the top surface of the photodiode 2 due to random noises.

The photodiode 2 is isolated from other adjacent photodiodes 2 (not shown) or adjacent semiconductor devices (not shown) by an isolation region 3 formed in part of the top surface of the substrate 1 of semiconductor located around the photodiode 2. The isolation region 3 is formed of an embedded layer 14 of silicon with which a trench is filled.

A thin $P^+$-type silicon layer 7 covering the sidewalls and bottom of the trench for the isolation region 3 and a P-type silicon layer 8 coming into contact with the lowest surface of the $P^+$-type silicon layer 7 are formed to come into contact with the side surfaces of the first semiconductor layer 4 forming part of the charge accumulation region. The $P^+$-type surface layer 5 and the second semiconductor layer 6 are electrically connected to each other through the $P^+$-type silicon layer 7 and the P-type silicon layer 8. Therefore, the first semiconductor layer 4 is electrically isolated from other devices and the other region of a substrate. As a result, charges do not leak.

In the case where silicon is used for the embedded layer 14 as described in this embodiment, the embedded layer 14 and the substrate 1 of silicon have substantially the same thermal expansion coefficient. Therefore, stress is not applied to the photodiode 2 in heat treatment executed in various process steps for fabricating a solid state imaging apparatus. This can suppress the production of white defects due to stress.

Next, a fabrication method for a solid state imaging apparatus according to this embodiment will be described with reference to the drawings. FIGS. 3(a) through 3(d) are cross-sectional views illustrating process steps in the fabrication method for the solid state imaging apparatus step by step.

Figure 3A:
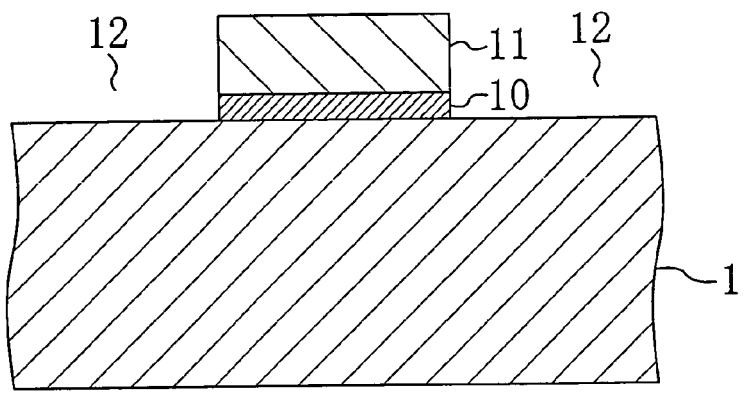
FIGS. 3(a) through 3(d) are cross-sectional views illustrating process steps in a fabrication method for the photodiode section of the solid state imaging apparatus according to the first embodiment of the present invention.

First, as illustrated in FIG. 3(a), a pad insulating film 10 made of a silicon oxide film is formed on a substrate 1 of silicon to have a thickness of approximately 1 through 50 nm. An oxidation-resistant film 11 made of a silicon nitride film or any other film is formed on the pad insulating film 10 to have a thickness of 50 through 400 nm. A resist (not shown) is formed on the oxidation-resistant film 11 to have an opening in its predetermined region.

Next, the entire substrate region is etched using the resist as a mask. In this way, the pad insulating film 10 and the oxidation-resistant film 11 are selectively removed to expose a predetermined region of the top surface of the substrate 1 of semiconductor, thereby forming an opening 12. Thereafter, the resist is removed. The opening 12 is set to have a width of approximately 0.13 through 30.0 μm.

Figure 3B:
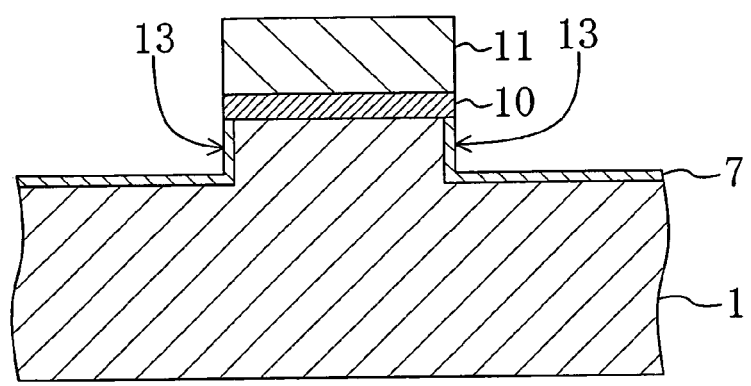

Subsequently, as illustrated in FIG. 3(b), in a trench formation step in which the substrate 1 of semiconductor is selectively etched using the oxidation-resistant film 11 as a mask, a trench 13 is formed under the opening 12. The trench 13 has a depth of 10 through 800 nm. Furthermore, boron serving as a P-type impurity is implanted from above the substrate 1 of silicon thereinto under the following implantation conditions: an implantation energy of 2.0 through 50 KeV and a dose of $1\times10^{11}$ through $1\times10^{15}$ ions/cm$^2$. In this way, a $P^+$-type silicon layer 7 is formed at the sides and bottom of the trench 13 located in the top surface of the substrate 1 of semiconductor. The above implantation conditions are adjusted to allow the binding of charges traveling from one interface state to another interface state and thus causing dark current.

Figure 3C:
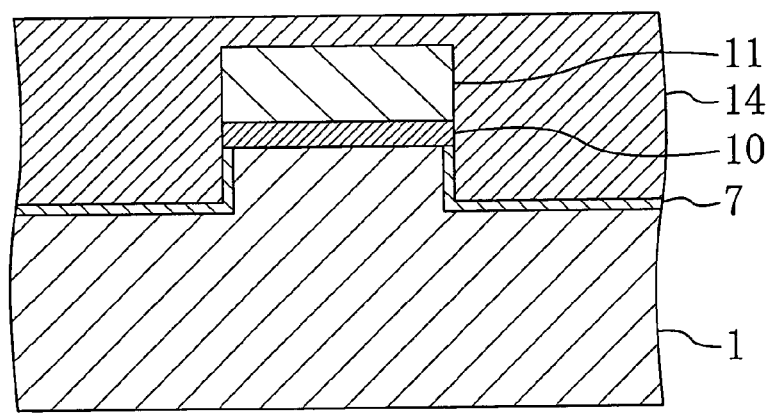

Next, as illustrated in FIG. 3(c), in a silicon film deposition step, the trench 13 is filled with an embedded layer 14 of silicon by chemical vapor deposition (CVD) with excellent coverage. In this case, an amorphous or polycrystalline silicon film is used as the embedded layer 14. This permits the formation of the embedded layer 14 at a low temperature, resulting in the reduced damage to the substrate 1 of semiconductor due to thermal stress. Furthermore, since thermal diffusion of an impurity element can be reduced, this facilitates the formation of the $P^+$-type silicon layer 7 at the boundary between an isolation region 3 and the substrate 1 of silicon. This can reduce the charges produced at the boundary between the isolation region 3 and the substrate 1 of silicon, resulting in the reduced random noises.

Figure 3D:
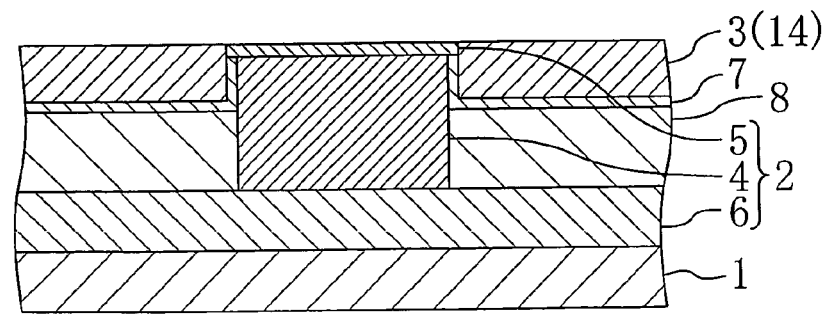

Subsequently, as illustrated in FIG. 3(d), the oxidation-resistant film 11 and part of the pad insulating film 10 are removed by wet etching to form an isolation region 3. This process step may be sectioned into two stages. More particularly, first, the oxidation-resistant film 11 and part of the pad insulating film 10 may be removed by chemical mechanical polishing (CMP) or dry etching, and then the remaining part of the pad insulating film 10 may be removed by wet etching.

Thereafter, ions are implanted into a predetermined region of the substrate 1 of semiconductor, thereby forming a photodiode 2 and active regions of semiconductor devices (not shown). Subsequently, a gate insulating film, a gate interconnect, an interlayer dielectric, a signal line, and a pulse transmission line, and other elements are formed in a known method, thereby fabricating a solid state imaging apparatus of this embodiment.

Although in this embodiment the embedded layer 14 is formed of silicon which does not contain any impurity, the same effect can be obtained even in the case where the embedded layer 14 is formed of silicon which contains a small amount of impurity made of elements, such as oxygen or nitrogen. Furthermore, in this case, the parasitic capacitance between each of interconnects formed on the isolation region 3 and the substrate 1 can be reduced.

Furthermore, in the case where a solid state imaging apparatus is designed to have only N-channel type transistors as transistors, a film containing a P-type impurity is preferably used as the embedded layer 14. Since in this case a gate interconnect formed on the isolation region 3 is of an N type, this can reduce the parasitic capacitance between the gate interconnect and the substrate 1. Likewise, in the case where a solid state imaging apparatus is designed to have only P-channel type transistors as transistors, a film containing an N-type impurity need be used as the embedded layer 14.

In the case where a solid state imaging apparatus includes both N-channel type transistors and P-channel type transistors, it is preferable that a film containing a P-type impurity is used for part of the isolation region 3 between each adjacent pair of the N-channel type transistors and between the photodiode and each of adjacent N-channel type transistors and a film containing an N-type impurity is used for part of the isolation region 3 between each adjacent pair of the P-channel type transistors and between the photodiode and each of adjacent P-channel type transistors. A film of the conductivity type opposite to that of a gate electrode formed on the isolation region 3 is preferably used for parts of the isolation region 3 between N-channel type transistors and adjacent P-channel type transistors.

A silicon film containing an N-type or P-type impurity may be deposited from a material containing an N-type or P-type impurity by CVD or may be formed by forming a silicon film which does not contain any impurity and then implanting an N-type or P-type impurity into the silicon film. The amount of the impurity is preferably $1\times10^{18}$ through $1\times10^{22}$ ions/cm$^3$.

In the case where a film containing an N-type or P-type impurity is used for the isolation region 3, the isolation region 3 is preferably grounded and biased to improve the isolation property.

According to the solid state imaging apparatus of the present invention, a trench 13 is formed in a substrate 1 of silicon and then filled with a silicon film by CVD, thereby forming an isolation region 3. Since the substrate 1 of silicon and the isolation region 3 are therefore made of the same material, this can reduce the stress in heat treatment. Therefore, it is less likely to produce defects coming from the stress at the boundary between the isolation region 3 and the substrate 1 of silicon. This can prevent dark current and white defects from being produced in a photodiode due to the above defects.

To be specific, in the known solid state imaging apparatus in which an isolation region is formed by STI, approximately 10,000 white defects were observed for one million pixels. On the other hand, in the solid state imaging apparatus of this embodiment in which a silicon film is used as an isolation region, the number of white defects is 100 or less. The white defects represent pixels each producing an output of 10 mV or more when there is no incident light.

Since a $P^+$-type silicon layer 7 containing a P-type impurity is formed at the sides and bottom of the trench 13, an energy barrier is formed between the vicinity of the surface of each sidewall of the substrate formed by the formation of the trench 13 and an active region of an adjacent semiconductor device. This can suppress the travel of carriers and prevent dark current from traveling from one interface state to another in the sidewalls of the trench 13 and passing through the active region of the semiconductor device. In this embodiment, the adjacent semiconductor device has an N-type active region and a PNP-type or NP-type photodiode 2.

Figure 4:
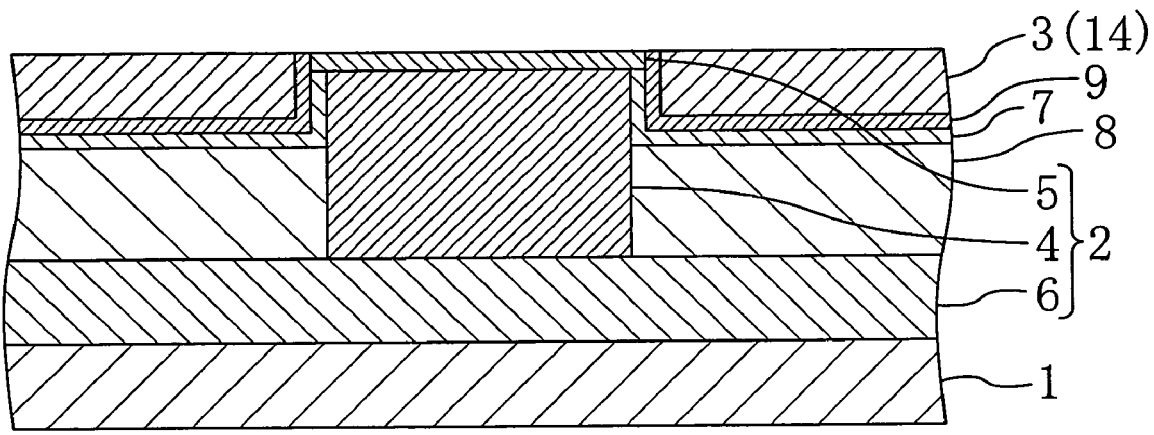
FIG. 4 is a cross-sectional view illustrating a photodiode section of another exemplary solid state imaging apparatus according to the first embodiment of the present invention.

As illustrated in FIG. 4, an insulating film 9 may be formed at the boundary between the isolation region 3 and the photodiode 2. Even in the case where the isolation region 3 is formed of only a silicon film, sufficient isolation can be achieved. However, the further formation of a thin insulating film 9 provides electrical isolation between a gate interconnect formed on the isolation region 3 and the substrate 1 of semiconductor, resulting in the reduced parasitic capacitance therebetween. Furthermore, the electrical isolation property can be improved. As a result, when a signal pulse is applied to a gate interconnect, delays can be reduced and therefore transistors arranged in each pixel can be driven at high speed.

Since the insulating film 9 is very thin, the influence of stress due to thermal expansion is only minimally exerted. An oxide film, a nitride film, an oxynitride film, or any other film can be used for the insulating film 9, and the insulating film 9 can be formed by CVD or thermal oxidation.

When as described above an insulating film 9 is formed as part of the isolation region 3, the number of white defects is increased as compared with when no insulating film 9 is formed, and approximately 300 white defects were observed. However, the number of white defects is obviously decreased as compared with when an isolation region is formed by STI. Therefore, it is considered that the formation of the insulating film 9 can provide the effect of reducing the stress produced due to heat treatment.

In this embodiment, the isolation region 3 is formed of a silicon film. However, in the case where it is formed of a material having a thermal expansion coefficient larger than silicon dioxide ($SiO_2$) and equal to or smaller than silicon, more particularly, a thermal expansion coefficient larger than $5.5 \times 10^{-7}$/K and equal to or smaller than $0.0415 \times 10^{-4}$/K, the same effect can be obtained.

In this embodiment, a description was given of the case where an isolation region 3 is formed in each pixel 26 illustrated in FIG. 1. A peripheral-circuit area 37 including a vertical shift register 28, a horizontal shift register 29, a timing generator circuit 30, and other elements can have an isolation region of the same structure as described in this embodiment.

Figure 5A:
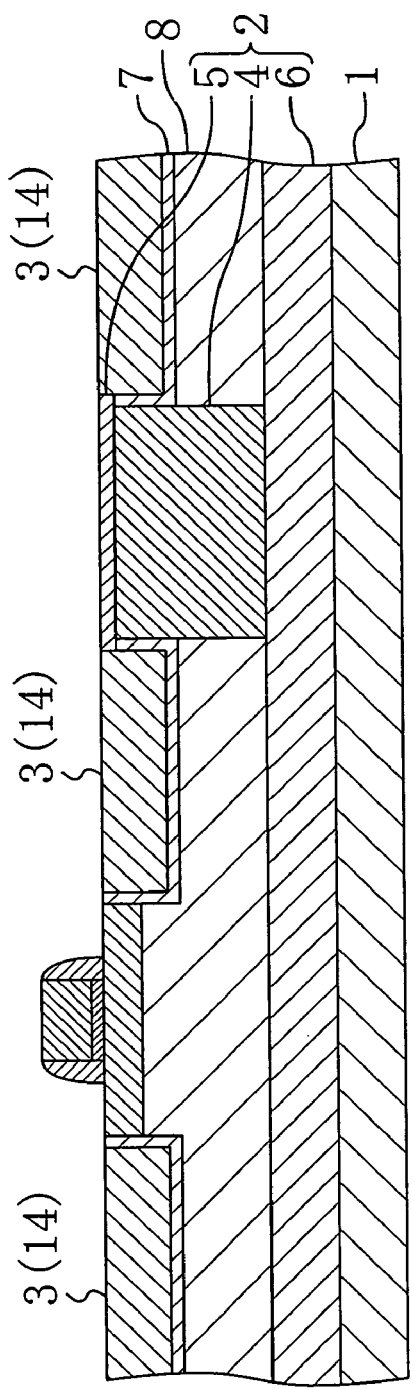
Figure 5B:
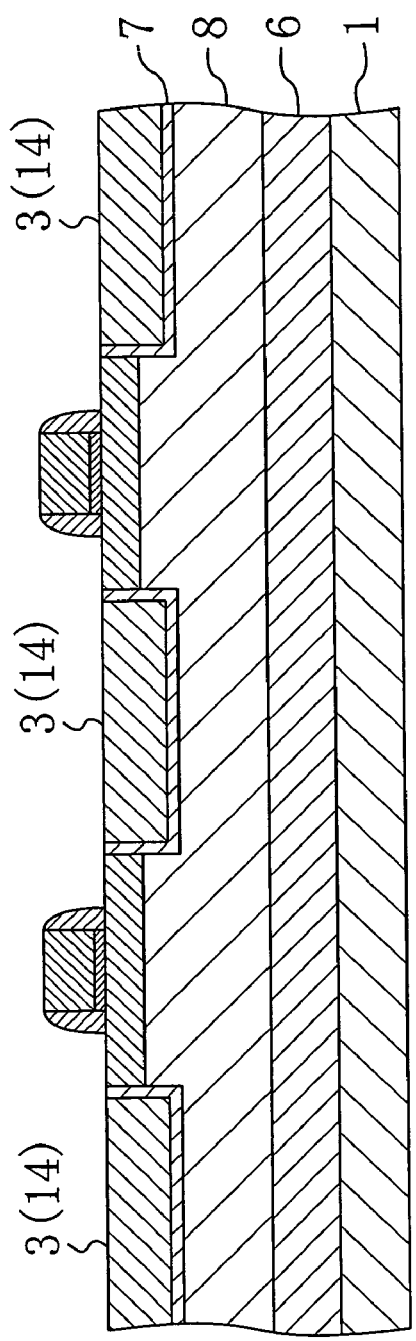

FIGS. 5(a) and 5(b) are cross-sectional views taken along the lines Va-Va and Vb-Vb in FIG. 1, respectively, in the case where respective isolation regions 3 of an imaging area 27 and a peripheral-circuit area 37 are filled with embedded layers 14 made of silicon. Since in this case the isolation regions of both the imaging area 27 and the peripheral-circuit area 37 have the same structure, this can save time for the step of forming isolation regions 3.

Figure 6A:
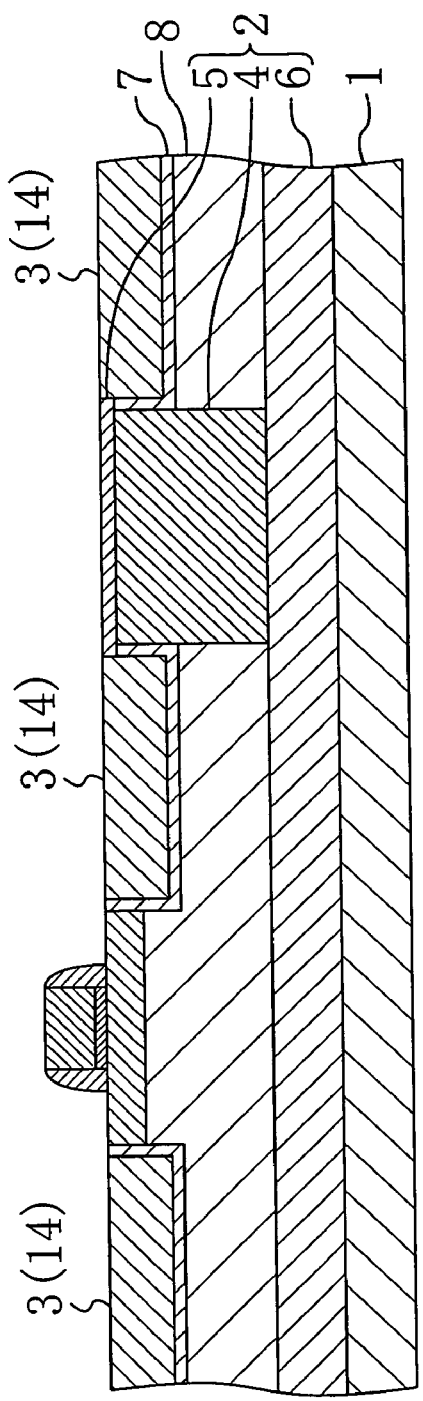
Figure 6B:
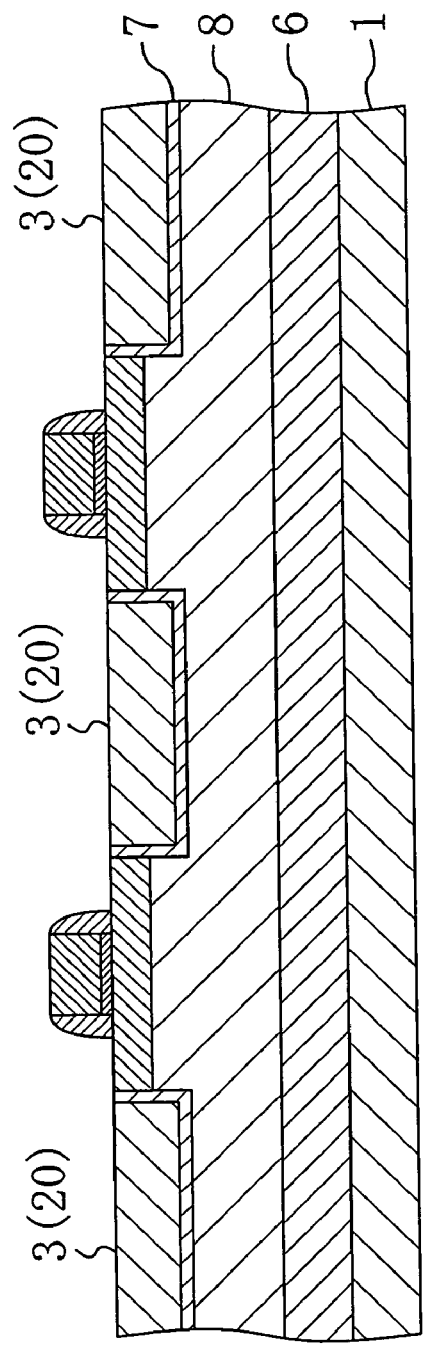

FIGS. 6(a) and 6(b) are cross-sectional views taken along the lines Va-Va and Vb-Vb in FIG. 1, respectively, in the case where an isolation region 3 of an imaging area 27 is filled with an embedded layer 14 and an isolation region 3 of a peripheral-circuit area 37 has a known STI structure 20. Since in this case the isolation region of the peripheral-circuit area 37 is formed to have a known STI structure 20, a peripheral circuit can be formed which achieves a high-voltage and high-speed operation. The isolation region of the peripheral-circuit area 37 may be formed by LOCOS.

Embodiment 2

Figure 7:
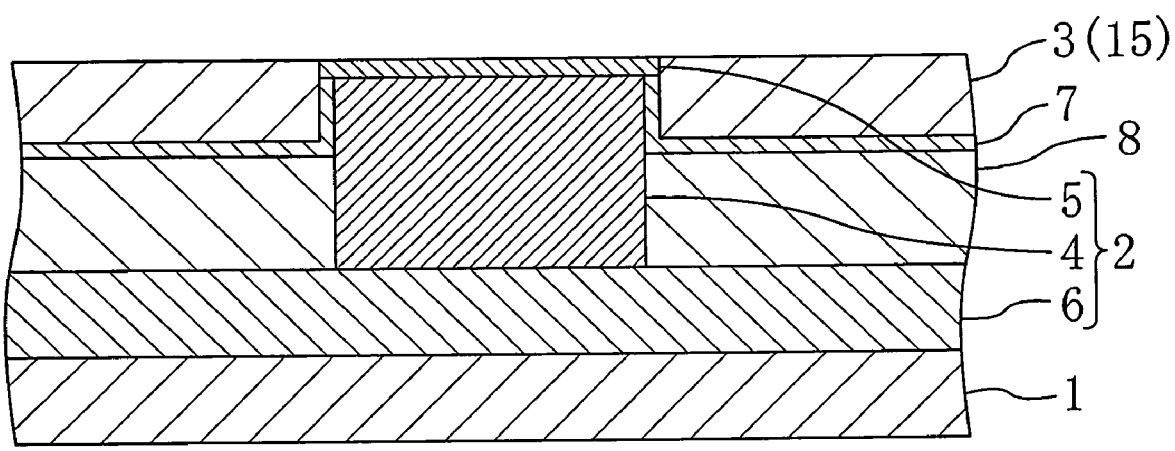
FIG. 7 is a cross-sectional view illustrating a photodiode section of a solid state imaging apparatus according to a second embodiment of the present invention.

A solid state imaging apparatus according to a second embodiment of the present invention will be described hereinafter with reference to the drawings. FIG. 7 illustrates a cross-sectional structure of a photodiode section of the solid state imaging apparatus of this embodiment. In FIG. 7, the same reference numerals are given to the same components as in FIG. 2, and therefore a description thereof is not given.

In the solid state imaging apparatus of this embodiment, an isolation region 3 is formed by filling a trench with a porous silicon film 15. Since the substrate 1 of silicon and the isolation region 3 are therefore made of the same material, this can reduce the stress due to heat treatment. Therefore, it is less likely to produce defects coming from the stress at the boundary between the isolation region 3 and the substrate 1 of silicon. This can prevent dark current and white defects from being produced in a photodiode due to the above defects. Furthermore, the permittivity of the isolation region 3 can be reduced. Therefore, in the case where a gate interconnect is formed on the isolation region 3, the parasitic capacitance between the gate interconnect and the substrate 1 of semiconductor can be reduced, resulting in high-speed charge readout operation.

Next, a fabrication method for a solid state imaging apparatus according to this embodiment will be described with reference to the drawings. FIGS. 8(a) through 8(d) are cross-sectional views illustrating process steps in the fabrication method for the solid state imaging apparatus step by step.

Figure 8A:
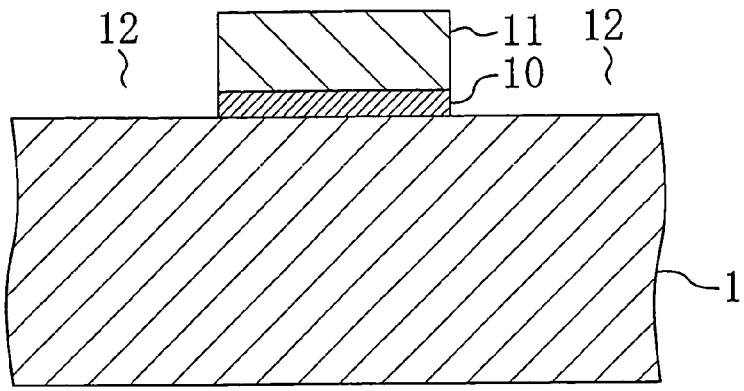
FIGS. 8(a) through 8(d) are cross-sectional views illustrating process steps in a fabrication method for a photodiode section of the solid state imaging apparatus according to the second embodiment of the present invention.

First, as illustrated in FIG. 8(a), a pad insulating film 10 made of a silicon oxide film is formed on a substrate 1 of silicon to have a thickness of approximately 1 through 50 nm. An oxidation-resistant film 11 made of a silicon nitride film or any other film is formed on the pad insulating film 10 to have a thickness of 50 through 400 nm. A resist (not shown) is formed on the oxidation-resistant film 11 to have an opening in its predetermined region.

Next, the entire substrate region is etched using the resist as a mask. In this way, the pad insulating film 10 and the oxidation-resistant film 11 are selectively removed to expose a predetermined region of the top surface of the substrate 1 of semiconductor, thereby forming an opening 12. Thereafter, the resist is removed. The opening 12 is set to have a width of approximately 0.13 through 30.0 μm.

Figure 8B:
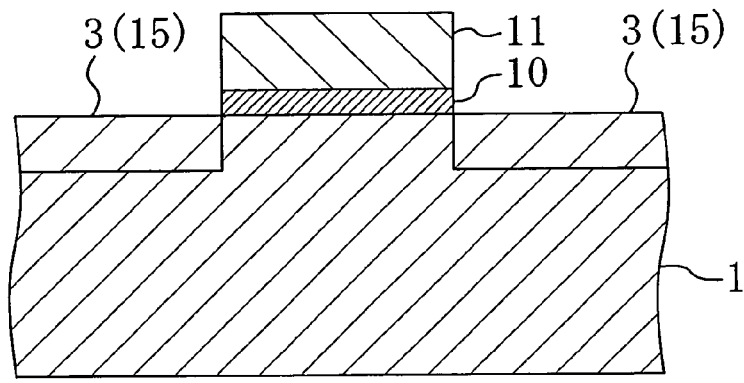

Subsequently, as illustrated in FIG. 8(b), the substrate 1 is anodized using the oxidation-resistant film 11 as a mask, thereby forming a porous silicon film 15 serving as an isolation region 3.

Figure 8C:
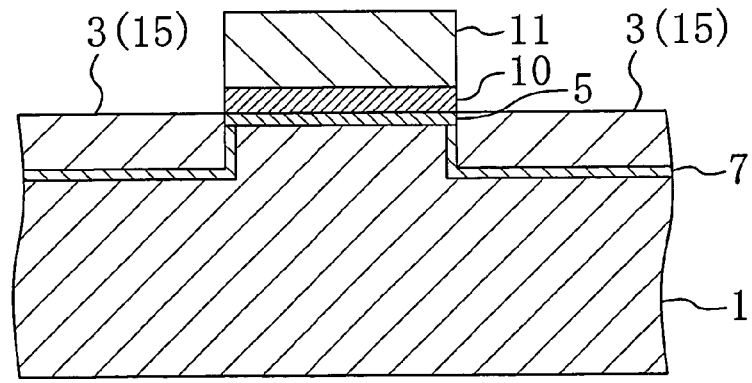

Next, as illustrated in FIG. 8(c), boron serving as a P-type impurity is implanted from above the substrate 1 of silicon thereinto under the following implantation conditions: an implantation energy of 2.0 through 50 KeV and a dose of $1\times10^{11}$ through $1\times10^{15}$ ions/cm$^2$. In this way, a P$^+$-type silicon layer 7 is formed to cover the sides and bottom of the porous silicon film 15, and a P$^+$-type surface layer 5 is formed which will serve as the uppermost layer of a photodiode 2. The above implantation conditions are adjusted to allow the binding of charges traveling from one interface state to another interface state and thus causing dark current.

Figure 8D:
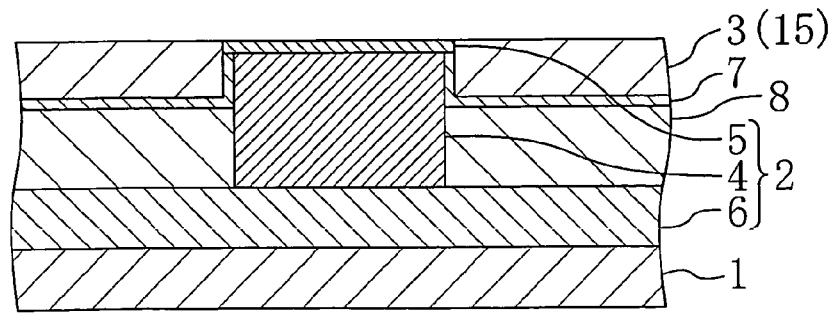

Subsequently, as illustrated in FIG. 8(d), the oxidation-resistant film 11 and part of the pad insulating film 10 are removed by wet etching. This process step may be sectioned into two stages. More particularly, first, the oxidation-resistant film 11 and part of the pad insulating film 10 may be removed by CMP or dry etching, and then the remaining part of the pad insulating film 10 may be removed by wet etching.

Thereafter, ions are implanted into a predetermined region of the substrate 1 of semiconductor, thereby forming a photodiode 2 and active regions of semiconductor devices (not shown). Subsequently, a gate insulating film, a gate interconnect, an interlayer dielectric, a signal line, and a pulse transmission line, and other elements are formed in a known method, thereby fabricating a solid state imaging apparatus of this embodiment.

In this embodiment, an N-type porous silicon film 15 is formed in a porous film formation step using anodization that will described below.

Figure 9:
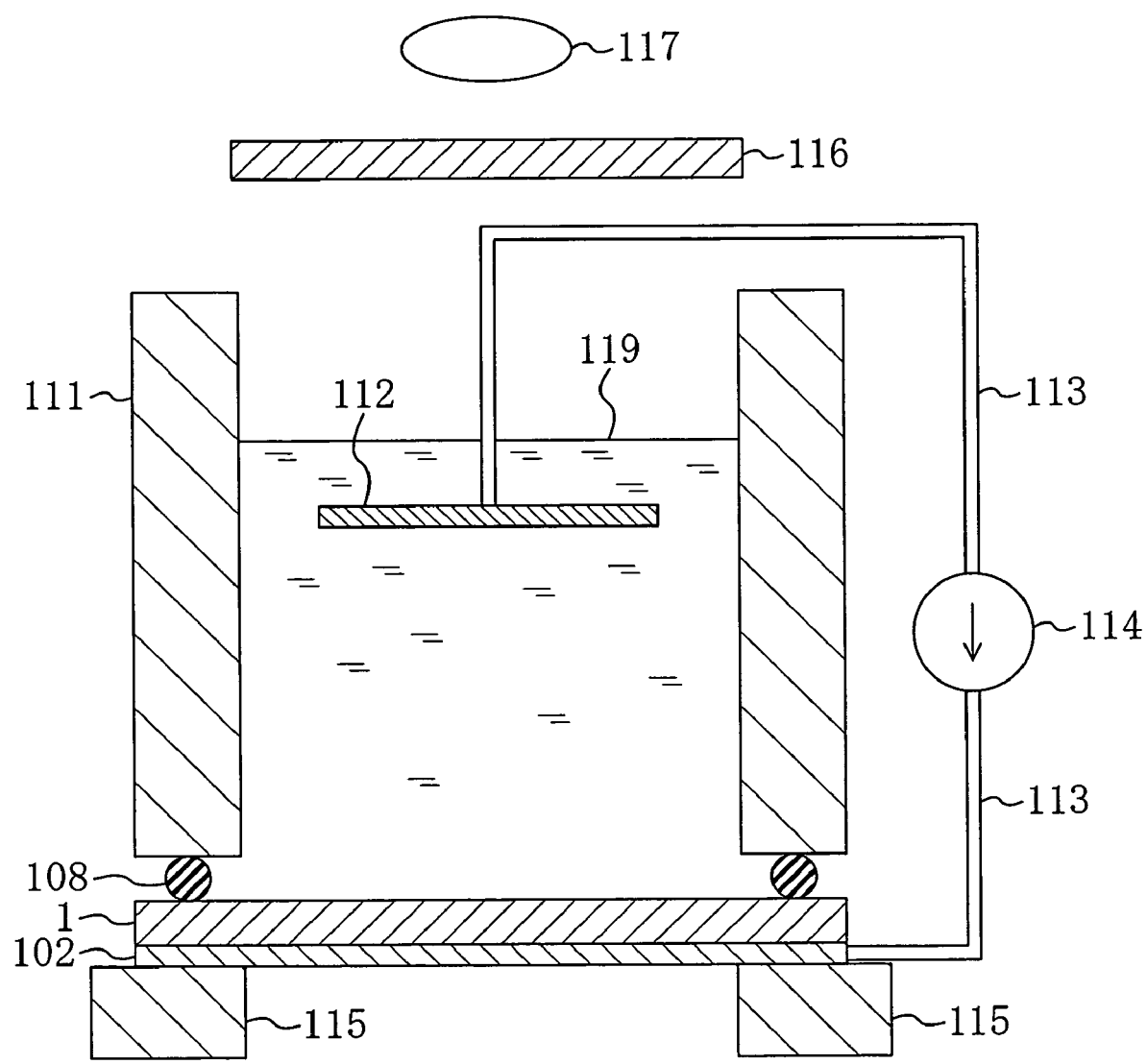
FIG. 9 is a schematic view illustrating an anodizing device used for a fabrication process for a solid state imaging apparatus of the present invention.

FIG. 9 illustrates an anodizing device used in the porous film formation step of this embodiment. As illustrated in FIG. 9, a substrate 1 of semiconductor on the back surface of which an electrode 102 is formed is supported on a silicon wafer stage 115, and a reactor 111 made of Tefron is placed on the substrate 1 of semiconductor with a hydrofluoric-acid-resistant O-ring 118 of fluorine rubber interposed therebetween. The reactor 111 is filled with a 1:1 solution of ethyl alcohol and hydrofluoric acid (5% solution), i.e., a reaction solution 119.

An anode of a constant-current source 114 is connected through a conductive line 113 to the electrode 2, and a cathode of the constant-current source 114 is connected through the conductive line 113 to an electrode 112 of platinum immersed in the reaction solution 119 in the reactor 111.

A 100 W tungsten lamp 117 is provided above the reactor 111, and light can be thus applied to the top surface of the substrate 1 of semiconductor. An infrared cut-filter 116 is provided below the tungsten lamp 117 to prevent the substrate 1 of silicon from being heated by the tungsten lamp 117. The intensity of light applied to part of the top surface of the substrate 1 of semiconductor to be anodized is set to become uniform.

Although in this embodiment platinum is used for the electrode 112, any other sufficiently hydrofluoric-acid-resistant and low-resistance material may be used therefor. As long as the reaction solution 119 contains hydrofluoric acid and ethyl alcohol, a porous silicon film 15 can be formed. Therefore, the concentration of the reaction solution 119 may be arbitrarily changed.

A current of 30 mA/cm$^3$ for anodization is allowed to flow for three seconds using this device. In this way, only a region of the top surface of the substrate 1 of semiconductor to which light is applied is made porous, thereby forming a porous silicon film 15. Although the speed at which the porous silicon film 15 can be formed varies according to the resistivity and current density of the substrate 1 of semiconductor, the porous silicon film 15 can be formed at a high speed of approximately 20 μm/min. The reason for this is that current flows concentratedly through the region of the substrate 1 into which ions are implanted during anodization.

The depth of the porous silicon film 15 can be adjusted by the current for anodization, the anodization time and the amount of light applied to the substrate 1 by the tungsten lamp 117. The current for anodization can be changed within a range of 1 through 50 mA/cm$^2$, and the anodization time can be changed within a range of one second through 30 minutes.

Since the oxidation-resistant film 11 serves as a mask during anodization, a porous silicon film 15 can be formed only in a predetermined isolation region.

According to the solid state imaging apparatus of this embodiment, a porous silicon film 15 is formed in part of the top surface of the substrate 1 of silicon using anodization, thereby forming an isolation region 3. Since the substrate 1 of silicon and the isolation region 3 are therefore made of the same material, this can reduce the stress in heat treatment. Therefore, it is less likely to produce defects. This can prevent dark current and white defects from being produced due to the above defects.

Furthermore, the permittivity of the isolation region 3 can be reduced by making the isolation region 3 porous. Therefore, in the case where a gate interconnect is formed on the isolation region 3, the parasitic capacitance between the gate interconnect and the substrate 1 of semiconductor can be reduced, leading to a high-speed charge readout operation.

In order to further reduce the influence of the parasitic capacitance between a gate electrode placed on the isolation region 3 and the substrate 1 of semiconductor, an insulating film may be formed by oxidizing part of the porous silicon film 15. For example, part of the porous silicon film 15 is heated in a gas containing oxygen atoms by furnace or resistance heating so as to be oxidized.

Furthermore, part of the porous silicon film 15 may be oxidized by pouring a hydrogen chloride solution into the reactor after anodization and passing current through the part of the porous silicon film 15 using the substrate 1 of semiconductor as an anode and the solution as a cathode. For example, after completion of anodization, a solution in the reactor 11 is replaced with a 10% hydrogen chloride solution and a current of 1 through 50 mA/cm$^2$ is passed through an electrode for 1 through 60 minutes, thereby forming an approximately 1-through 10-nm-thick oxide film.

Since the porous silicon film 15 is very likely to be oxidized, it is usually difficult to control the thickness of the oxide film. However, in the case where the oxidation step and the previous steps are successively carried out in the same reactor as described above, the thickness of the oxide film can be controlled.

In the known solid state imaging apparatus in which an isolation region is formed by STI, approximately 10,000 white defects were observed for one million pixels. On the other hand, in the solid state imaging apparatus of this embodiment in which a porous silicon film is formed as an isolation region, the number of white defects is 1,000 or less. Furthermore, when an insulating film is formed by oxidizing part of an isolation region, the number of white defects is increased as compared with when no oxide film is formed, and approximately 1,100 white defects were observed. However, the number of white defects is obviously decreased as compared with when an isolation region is formed by STI. Therefore, it is considered that the formation of the insulating film can provide the effect of reducing the stress produced due to heat treatment. The white defects represent pixels each producing an output of 10 mV or more when there is no incident light.

Instead of a fabrication method for a solid state imaging apparatus, the following method can be used. Like the first embodiment, a trench 13 is formed and filled with a silicon film, and then the silicon film is anodized using the device of this embodiment, thereby forming an isolation region 3 made of a porous silicon film 15 having the same cross-sectional structure as shown in FIG. 7. Since in this case part of the substrate 1 of semiconductor through which current is passed is selectively made porous, it is anodized using the silicon film with which the trench 13 is filled as an anode and the reaction solution 119 as a cathode. Since a porous silicon film 15 is formed by reaction between holes and the reaction solution 119, holes need not be produced by the tungsten lamp 117. This eliminates the need for using the tungsten lamp 117. When the silicon film contains a P-type impurity, the porous silicon film 15 can be of a P type.

Modification of Embodiment 2

A solid state imaging apparatus according to a modification of a second embodiment of the present invention will be described hereinafter with reference to the drawings.

The solid state imaging apparatus of this modification is characterized in that an isolation region 3 illustrated in FIG. 7 is formed of a P-type porous silicon.

FIGS. 10(a) through 10(d) are cross-sectional views illustrating process steps in a fabrication method for the solid state imaging apparatus of this modification step by step.

Figure 10A:
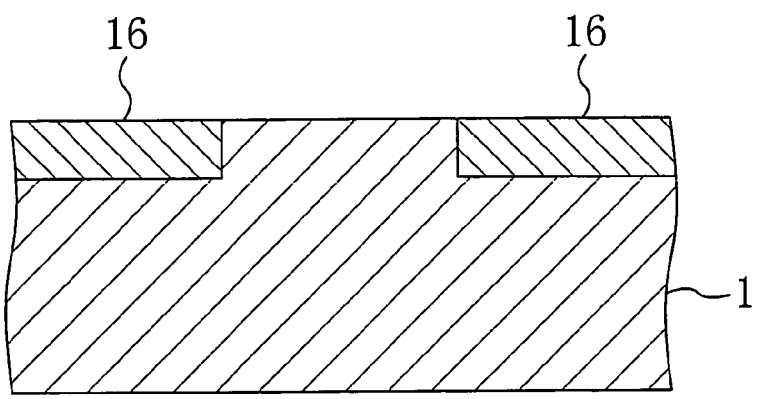
FIGS. 10(*a*) through 10(*d*) are cross-sectional views illustrating process steps in a fabrication method for a photodiode section of a solid state imaging apparatus according to a modification of the second embodiment of the present invention.

First, as illustrated in FIG. 10(a), a resist (not shown) is formed to have an opening in its predetermined region, and ions are implanted into a substrate 1 of semiconductor using the resist as a mask, thereby forming a P-type silicon section 16 containing a P-type impurity in predetermined part of the substrate 1 of semiconductor.

Figure 10B:
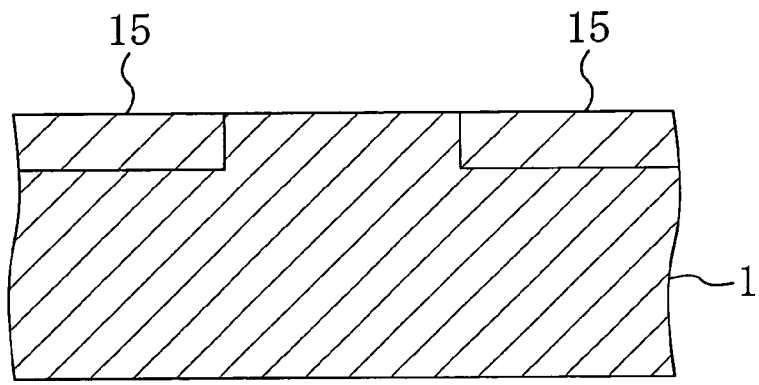

Next, as illustrated in FIG. 10(b), an electrode for anodization is formed on part of the P-type silicon section 16 located in part of the top surface of the substrate 1 of semiconductor, and then a porous silicon film 15 is formed by anodizing the P-type silicon section 16.

The P-type silicon section 16 is anodized in the same procedure as in the second embodiment. Since in this modification the P-type silicon section 16 is selectively made porous, it is anodized using the P-type silicon section 16 as an anode and a reaction solution 119 as a cathode. Since a silicon film containing a P-type impurity is subjected to anodization, holes need not be produced by a lamp. This eliminates the need for using a tungsten lamp 117. Therefore, in this modification, a process allowing a short turnaround time can be achieved.

Figure 10C:
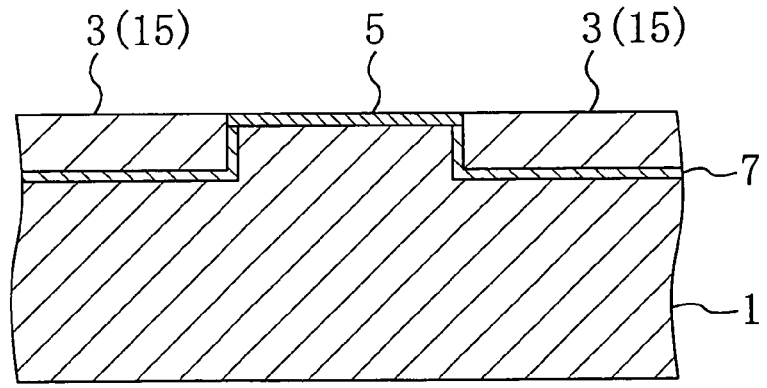

Next, as illustrated in FIG. 10(c), boron serving as a P-type impurity is implanted from above the substrate 1 of silicon thereinto under the following implantation conditions: an implantation energy of 2.0 through 50 KeV and a dose of $1 \times 10^{11}$ through $1 \times 10^{15}$ ions/cm². In this way, a P$^+$-type silicon layer 7 is formed to cover the sides and bottom of the porous silicon film 15, and a P$^+$-type surface layer 5 is formed which will serve as the uppermost layer of a photodiode 2. The above implantation conditions are adjusted to allow the binding of charges traveling from one interface state to another interface state and thus causing dark current.

Figure 10D:
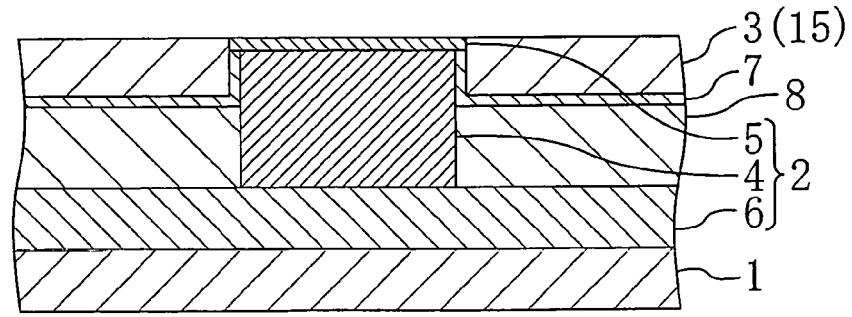

Subsequently, as illustrated in FIG. 10(d), ions are implanted into a predetermined region of the substrate 1 of semiconductor, thereby forming a photodiode 2 and active regions of semiconductor devices (not shown). Subsequently, a gate insulating film, a gate interconnect, an interlayer dielectric, a signal line, and a pulse transmission line, and other elements are formed in a known method, thereby fabricating a solid state imaging apparatus of this embodiment.

In this modification, the porous silicon film 15 serving as an isolation region 3 is of a P type. In the case where an N-channel type transistor forms a semiconductor device, a gate interconnect formed on the isolation region 3 is of an N type. Therefore, when porous silicon containing a P-type impurity is used as the isolation region 3 as in this modification, this can reduce the capacitance between the gate interconnect and the substrate 1 of silicon, resulting in a solid state imaging apparatus operated at high speed.

In the case where both N-type and P-type semiconductor devices are formed at a single substrate, both an N-type porous silicon film described in the second embodiment and a P-type porous silicon film described in this modification need be formed as necessary.

Like the second embodiment, an oxide film may be formed by thermally oxidizing part of the porous silicon film 15 or oxidizing part of the porous silicon film 15 in an electrolytic cell.

Embodiment 3

A solid state imaging apparatus according to a third embodiment of the present invention and a fabrication method for the same will be described hereinafter with reference to the drawings.

Figure 11:
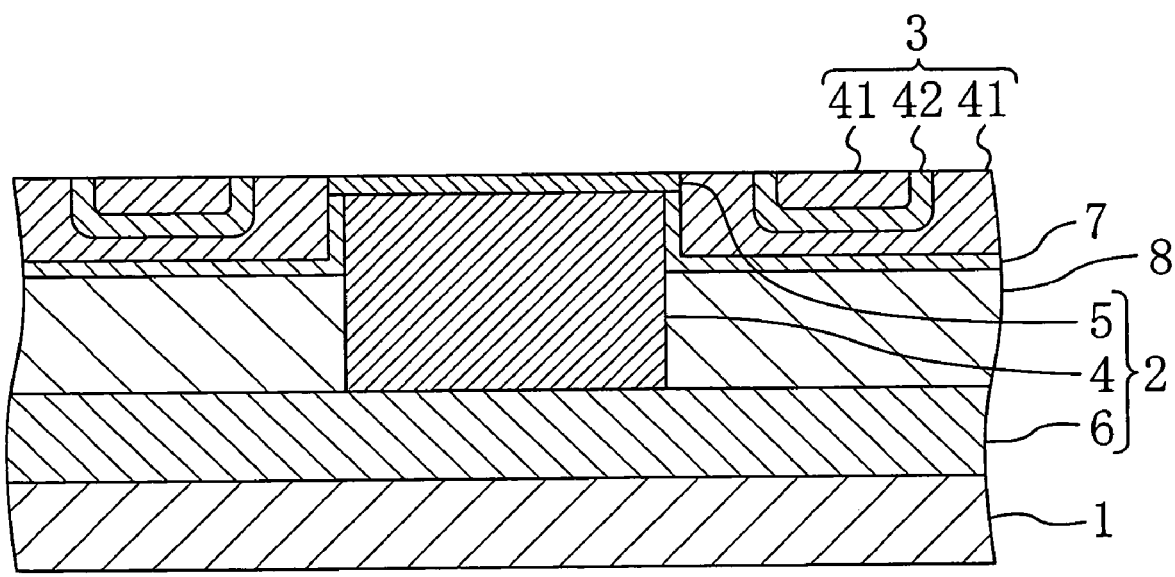
FIG. 11 is a cross-sectional view illustrating a photodiode section of a solid state imaging apparatus according to a third embodiment of the present invention.

FIG. 11 is a cross-sectional view illustrating a photodiode section of the solid state imaging apparatus of this embodiment. In FIG. 11, the same reference numerals are given to the same components as in FIG. 2, and a description thereof is not given. In this embodiment, an isolation region 3 is formed of a silicon film 41 and a porous silicon film 42 to reduce the stress in heat treatment. As illustrated in FIG. 11, a U-shaped porous silicon film 42 is embedded in the silicon film 41.

FIGS. 12(a) through 12(e) are cross-sectional views illustrating process steps in the fabrication method for the solid state imaging apparatus step by step.

Figure 12A:
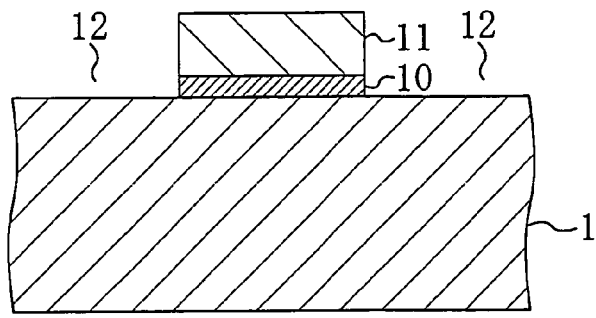
FIGS. 12(*a*) through 12(*e*) are cross-sectional views illustrating process steps in a fabrication method for a photodiode section of the solid state imaging apparatus according to the third embodiment of the present invention.

First, as illustrated in FIG. 12(a), a pad insulating film 10 made of a silicon oxide film is formed on a substrate 1 of silicon to have a thickness of approximately 1 through 50 nm. An oxidation-resistant film 11 made of a silicon nitride film or any other film is formed on the pad insulating film 10 to have a thickness of 50 through 400 nm. A resist (not shown) is formed on the oxidation-resistant film 11 to have an opening in its predetermined region.

Next, the entire substrate region is etched using the resist as a mask. In this way, the pad insulating film 10 and the oxidation-resistant film 11 are selectively removed to expose a predetermined region of the top surface of the substrate 1 of semiconductor, thereby forming an opening 12. Thereafter, the resist is removed. The opening 12 is set to have a width of approximately 0.13 through 30.0 μm.

Figure 12B:
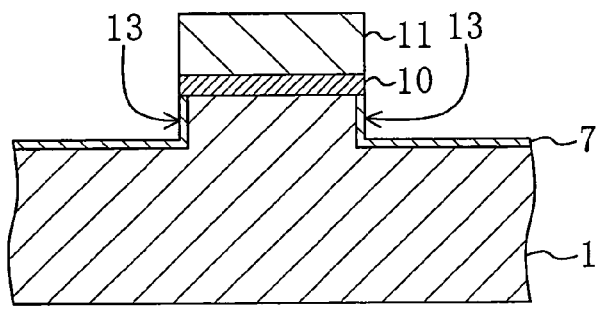

Subsequently, as illustrated in FIG. 12(b), in a trench formation step in which the substrate 1 of semiconductor is selectively etched using the oxidation-resistant film 11 as a mask, a trench 13 is formed under the opening 12. The trench 13 has a depth of 10 through 800 nm. Furthermore, boron serving as a P-type impurity is implanted from above the substrate 1 of silicon thereinto under the following implantation conditions: an implantation energy of 2.0 through 50 KeV and a dose of $1 \times 10^{11}$ through $1 \times 10^{15}$ ions/cm². In this way, a P$^+$-type silicon layer 7 is formed at the sides and bottom of the trench 13 located in the top surface of the substrate 1 of semiconductor. The above implantation conditions are adjusted to allow the binding of charges traveling from one interface state to another interface state and thus causing dark current.

Figure 12C:
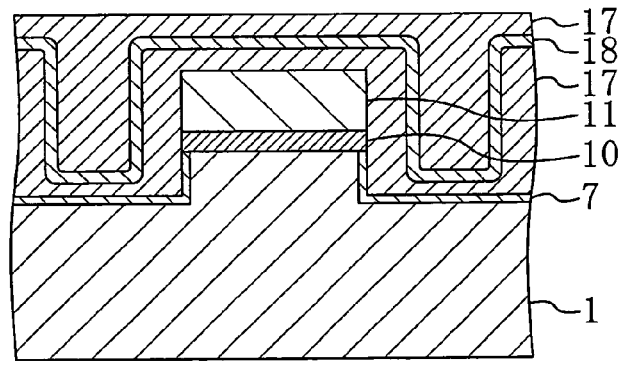

Next, as illustrated in FIG. 12(c), a silicon film 17 containing an N-type impurity and a silicon film 18 containing a P-type impurity are repeatedly deposited in the trench 13 by CVD using the oxidation-resistant film 11 as a mask, thereby completely filling the trench 13.

In this embodiment, first, the silicon film 17 containing an N-type impurity is deposited in the trench 13 by CVD to have a thickness of 10 through 100 nm. Next, the silicon film 18 containing a P-type impurity is deposited on the silicon film 17 containing an N-type impurity to have a thickness of 10 through 100 nm. Furthermore, another silicon film 17 containing an N-type impurity is deposited on the silicon film 18 containing a P-type impurity to completely fill the trench 13. For the order of the deposited films, the silicon films 17 containing an N-type impurity are replaced with silicon films 18 containing a P-type impurity and the silicon film 18 containing a P-type impurity may be replaced with a silicon film 17 containing an N-type impurity. In this embodiment, a polycrystalline silicon film may be used as a silicon film, and instead of three layers, four or more layers may be deposited in the trench 13.

Figure 12D:
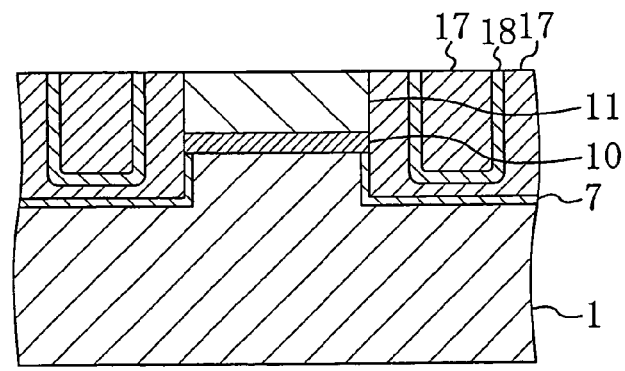

Next, as illustrated in FIG. 12(d), the entire substrate region is subjected to CMP using the oxidation-resistant film 11 as a stopper to expose part of the silicon film 18 containing a P-type impurity. Thereafter, part of the isolation region 3 is made porous using an anodizing device as in the second embodiment. At this time, an electrode is formed on part of the isolation region 3 located in part of the top surface of the substrate 1 of semiconductor that is not immersed in a solution. The part of the isolation region 3 is anodized without using a tungsten lamp 117. In this way, only the silicon film 18 containing a P-type impurity is selectively made porous to form a porous silicon film 42, and the silicon film 17 containing an N-type impurity is left as a silicon film 41 without being made porous.

Figure 12E:
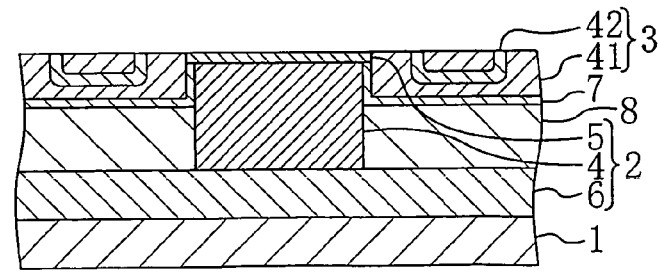

Thereafter, as illustrated in FIG. 12(e), the oxidation-resistant film 11 and part of the pad insulating film 10 are removed by wet etching.

Next, ions are implanted into a predetermined region of the substrate 1 of semiconductor, thereby forming a photodiode 2 and active regions of semiconductor devices (not shown). Subsequently, a gate insulating film, a gate interconnect, an interlayer dielectric, a signal line, and a pulse transmission line, and other elements are formed in a known method, thereby fabricating a solid state imaging apparatus of this embodiment.

According to the solid state imaging apparatus of this embodiment, an isolation region 3 is formed of silicon with which a trench 13 is filled and which is partly made porous. Since the substrate 1 of silicon and the isolation region 3 are therefore made of the same material, this can reduce the stress in heat treatment. Therefore, it is less likely to produce defects. This can prevent dark current and white defects from being produced due to the above defects. Furthermore, since the isolation region is partly made porous, this can reduce the permittivity of the isolation region, resulting in the enhanced operating speed of an imaging apparatus.

To be specific, in the known solid state imaging apparatus in which an isolation region is formed by STI, approximately 10,000 white defects were observed for one million pixels. On the other hand, in the solid state imaging apparatus of this embodiment in which a silicon film and a porous silicon film are formed as an isolation region, the number of white defects is 500 or less. The white defects represent pixels each producing an output of 10 mV or more when there is no incident light.

Embodiment 4

A solid state imaging apparatus according to a third embodiment of the present invention and a fabrication method for the same will be described hereinafter with reference to the drawings.

Figure 13:
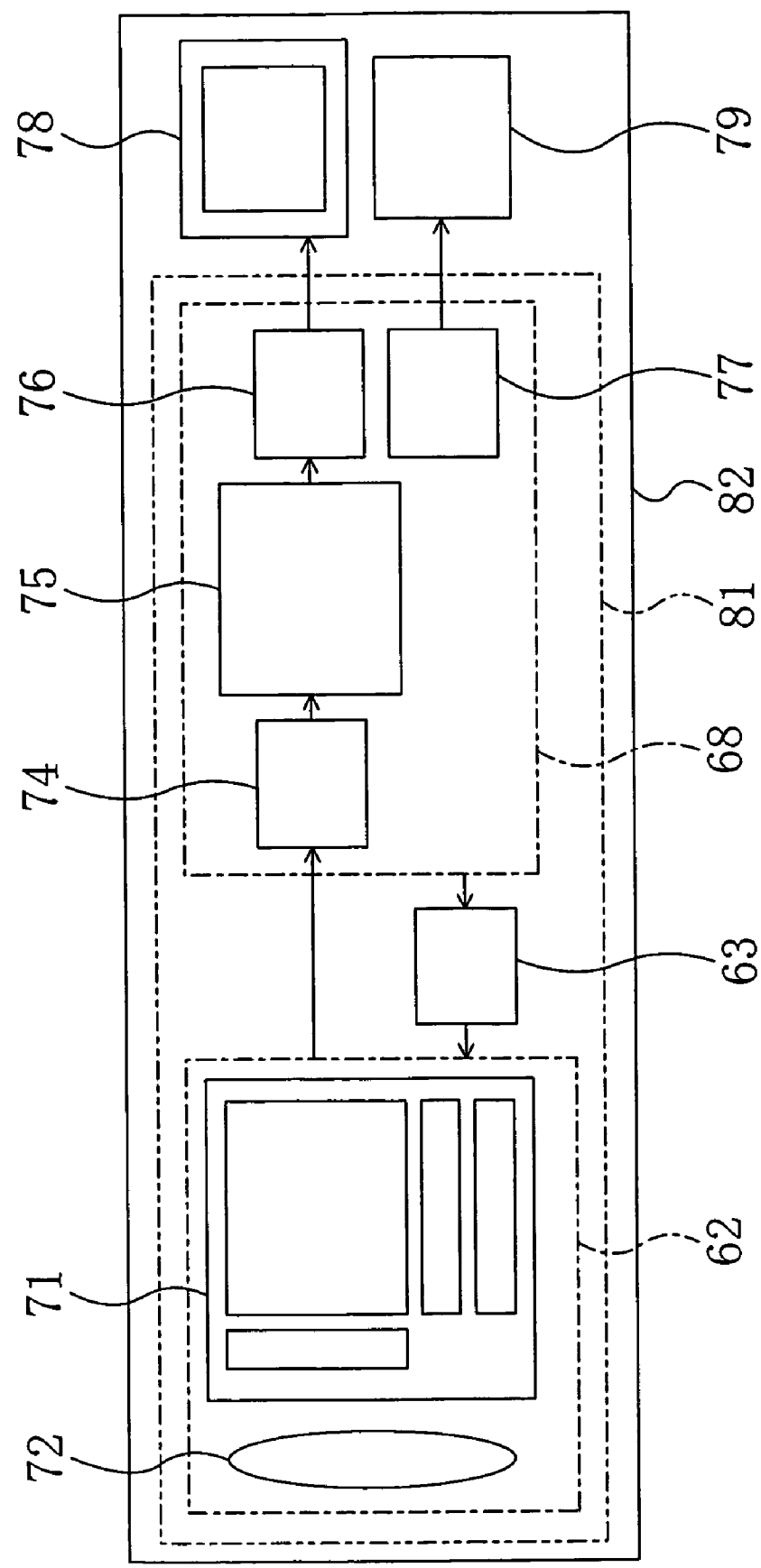
FIG. 13 is a block diagram illustrating the structure of a camera according to a fourth embodiment of the present invention.
Figure 14:
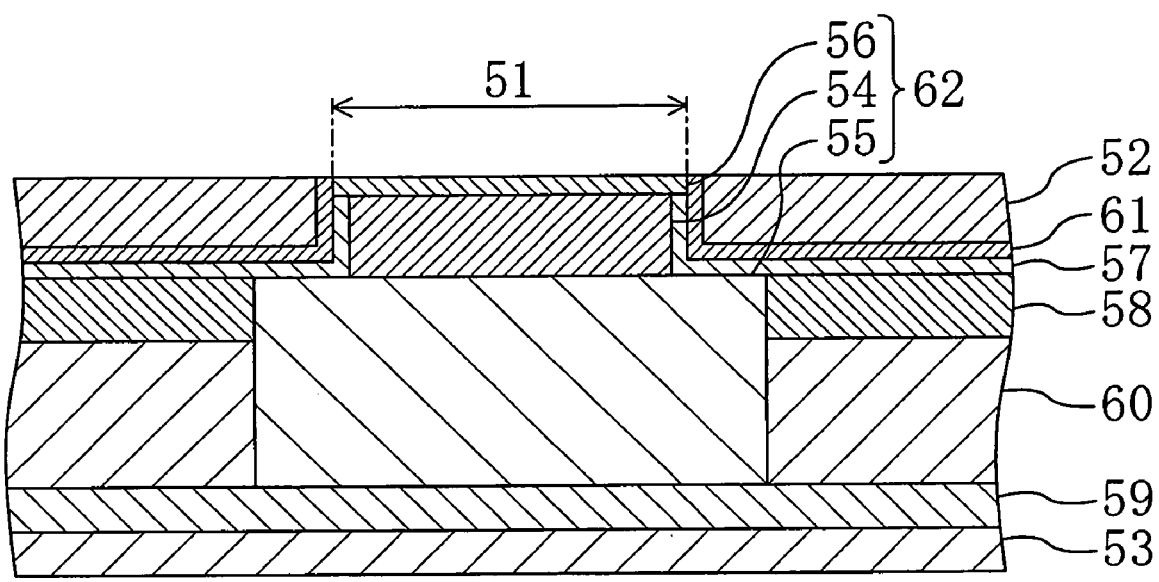
FIG. 14 is a cross-sectional view illustrating a photodiode section of a solid state imaging apparatus according to a known example.

FIG. 13 schematically illustrates the structure of a camera according to this embodiment. As illustrated in FIG. 13, a camera module 81 of this embodiment includes a sensor module 62 obtained by attaching an optical system 72 to the solid state imaging apparatus 71 of the first embodiment of the present invention, a driving circuit 63 for driving the sensor module 62, and a digital signal processor (DSP) 68 for processing a signal delivered from the sensor module 62. The camera module 81 is connected to a display 78 and a recording medium 79 as necessary, thereby forming a camera system 82.

Light incident through the optical system 72 on the solid state imaging apparatus 71 is output as an electrical signal by the solid state imaging apparatus 71, and the output electrical signal is temporarily accumulated in a preprocessing unit 74 of the DSP 68. In the solid state imaging apparatus 71 in which a plurality of photodiodes are arranged in matrix, charges accumulated in the photodiodes are read out for each of rows. Therefore, the number of memories of the preprocessing unit 74 is the same as that of photodiodes formed for each row of the solid state imaging apparatus 71. The charges accumulated in the photodiodes and read out for each row are finally converted into a color image by an image processing circuit 75 and further converted into a signal for displaying an image on the display 78 by a display processing circuit 76. Furthermore, the DSP 68 is provided with a medium control circuit 77, and an image can be stored in a recording medium 79.

Since as described above the camera of this embodiment includes the solid state imaging apparatus 71 allowing only small numbers of random noises and white defects, this can significantly reduce noises appearing in a shot image. This permits high-resolution imaging. Furthermore, since the number of noises included in a signal from an imaging device is small, this can reduce the load on the DSP 68 in signal processing, such as noise reduction. As a result, a camera operating at high speed can be achieved.

Although in this embodiment the imaging apparatus of the first embodiment is used, the same effect can be obtained even in the use of the imaging apparatus of any other embodiment or the modification.

Although in each embodiment an N-type silicon substrate is used, the same effect can be obtained even in the use of a P-type silicon substrate.

INDUSTRIAL APPLICABILITY

The present invention can provide a high-sensitivity solid state imaging apparatus, a method for fabricating the same and a camera using the same which prevent the production of random noises and white defects coming from charges produced due to stress to avoid reduction in the sensitivity of the solid state imaging apparatus and is useful for a solid state imaging apparatus in which an imaging area including a plurality of pixels is formed at part of a semiconductor substrate, a method for fabricating the same and a camera.

The invention claimed is:

1. A solid state imaging apparatus comprising:

a photoelectric conversion section formed in an imaging area of a silicon substrate, the photoelectric conversion section including:

a surface layer having a first conductivity type provided on a top portion of the silicon substrate, a first semiconductor layer made of silicon having a second conductivity type, serving as a charge accumulation region, and provided under the surface layer, and a second semiconductor layer made of silicon having the first conductivity type provided under the first semiconductor layer;

an isolation region formed in at least one part of the silicon substrate located around the photoelectric conversion section, the isolation region being made of a silicon film which fills an isolation trench formed on the semiconductor substrate;

a first silicon layer made of silicon having the first conductivity type formed in a region of the silicon substrate, and forming the bottom and sidewalls of the isolation trench; and a second silicon layer made of silicon having the first conductivity type in contact with a bottom side of the first silicon layer, wherein an impurity concentration of the second silicon layer is less than that of the first silicon layer, wherein the photoelectric conversion section is in contact with the isolation region, the first silicon layer, and the second silicon layer, and the second silicon layer is in physical contact with a side surface of the first semiconductor layer.

2. The solid state imaging apparatus of claim 1, further comprising an insulating film covering the bottom and sidewalls of the isolation trench.

3. The solid state imaging apparatus of claim 1, further comprising a MOS transistor formed in the imaging area, wherein the silicon film contains an impurity of the opposite conductivity type to source and drain regions of the MOS transistor.

4. The solid state imaging apparatus of claim 1, wherein the silicon film is made of amorphous silicon, polycrystalline silicon or porous silicon.

5. The solid state imaging apparatus of claim 1, wherein a depth of the first semiconductor layer is substantially the same as that of the second silicon layer.

6. The solid state imaging apparatus of claim 1, wherein the isolation region is grounded.

7. The solid state imaging apparatus of claim 1 wherein the isolation region is biased.

8. A camera comprising the solid state imaging apparatus according to claim 1.

* * * * *